United States Patent
Moeller et al.

(10) Patent No.: US 11,497,128 B2
(45) Date of Patent: Nov. 8, 2022

(54) DEVICE FOR ENSURING THE INSTALLATION OF A COMPONENT AT THE DESIGNATED INSTALLATION LOCATION OF SAID COMPONENT

(71) Applicant: Robert Bosch GmbH, Stuttgart (DE)

(72) Inventors: Birgit Moeller, Muehlacker (DE);
Mathias Dihlmann, Engelsbrand (DE);
Rainer Jakoby, Leonberg (DE); Sina Keller, Stuttgart (DE); Thorsten Weidinger, Ludwigsburg (DE)

( * ) Notice: Subject to any disclaimer, the term of this patent is extended or adjusted under 35 U.S.C. 154(b) by 684 days.

(21) Appl. No.: 16/484,861

(22) PCT Filed: Dec. 29, 2017

(86) PCT No.: PCT/EP2017/084811
§ 371 (c)(1),
(2) Date: Aug. 9, 2019

(87) PCT Pub. No.: WO2018/149543
PCT Pub. Date: Aug. 23, 2018

(65) Prior Publication Data
US 2020/0045838 A1   Feb. 6, 2020

(30) Foreign Application Priority Data

Feb. 15, 2017   (DE) .......................... 102017202364.3

(51) Int. Cl.
*G06F 1/16*      (2006.01)
*H05K 5/00*     (2006.01)
(Continued)

(52) U.S. Cl.
CPC ....... *H05K 5/0073* (2013.01); *F01N 13/1844* (2013.01); *G01D 11/245* (2013.01); *H05K 5/0078* (2013.01); *H05K 5/0204* (2013.01)

(58) Field of Classification Search
CPC .. H05K 5/0073; H05K 5/0078; H05K 5/0204; G01D 11/245; F01N 13/1844
See application file for complete search history.

(56) References Cited

U.S. PATENT DOCUMENTS

| | | | |
|---|---|---|---|
| 6,266,250 B1 * | 7/2001 | Foye ...................... | H02B 1/043 248/220.21 |
| 7,423,215 B2 * | 9/2008 | Cardenas ............... | H02G 3/081 174/53 |

(Continued)

FOREIGN PATENT DOCUMENTS

| | | |
|---|---|---|
| CN | 102785624 A | 11/2012 |
| CN | 105000056 A | 10/2015 |

(Continued)

OTHER PUBLICATIONS

International Search Report for PCT/EP2017/084811, dated Mar. 28, 2018.

*Primary Examiner* — Anthony M Haughton
(74) *Attorney, Agent, or Firm* — Norton Rose Fulbright US LLP; Gerard Messina

(57) ABSTRACT

A device is described for ensuring the installation of a component at the designated installation location of said component in a system, made up of two parts, the first part of the device being attached to the component, and the second part of the device being attached to the system to which the component will be attached, and, during installation of the component into the system at the designated installation location of said component, the first part of the device and the second part of the device interlock precisely and enable assembly, in that the first part of the device and the second part of the device interact exclusively mechanically and exclusively enable the ensuring of the installation of the component at the designated installation location of the component in the system. When installing the compo- (Continued)

nent at a non-designated installation location on the system, the interaction of the first part of the device and the second part of the device, which form a poka-yoke system with each other, prevents installation.

10 Claims, 3 Drawing Sheets

(51) Int. Cl.
*H05K 7/00* (2006.01)
*F01N 13/18* (2010.01)
*G01D 11/24* (2006.01)
*H05K 5/02* (2006.01)

(56) References Cited

U.S. PATENT DOCUMENTS

| | | | | |
|---|---|---|---|---|
| 7,663,060 | B2 * | 2/2010 | Nelson | H04Q 1/10 |
| | | | | 174/101 |
| 7,812,254 | B2 * | 10/2010 | Wayman | H02G 3/081 |
| | | | | 312/109 |
| 8,141,965 | B2 * | 3/2012 | Nelson | H05K 9/0049 |
| | | | | 312/223.1 |
| 8,254,850 | B2 * | 8/2012 | Wayman | H04B 1/03 |
| | | | | 455/115.2 |
| 8,461,453 | B2 * | 6/2013 | Puccini | H02B 1/32 |
| | | | | 174/541 |
| 8,552,294 | B2 * | 10/2013 | Li | H02G 3/26 |
| | | | | 174/72 A |
| 9,647,437 | B2 * | 5/2017 | Aznag | G02B 6/4444 |
| 2004/0112623 | A1 * | 6/2004 | L'Henaff | H05K 5/0204 |
| | | | | 174/59 |
| 2007/0267941 | A1 * | 11/2007 | Eidel | G01D 11/245 |
| | | | | 310/311 |
| 2015/0331087 | A1 * | 11/2015 | Philipp | H05K 5/0056 |
| | | | | 361/752 |

FOREIGN PATENT DOCUMENTS

| | | |
|---|---|---|
| DE | 2362060 A1 | 6/1975 |
| DE | 2455409 A1 | 8/1976 |
| DE | 10156049 A1 | 9/2002 |
| DE | 102004062466 A1 | 9/2005 |
| DE | 102009045722 A1 | 4/2011 |
| DE | 102011014424 A1 | 11/2011 |
| DE | 102012003617 A1 | 8/2013 |
| FR | 3006852 A1 | 12/2014 |

* cited by examiner

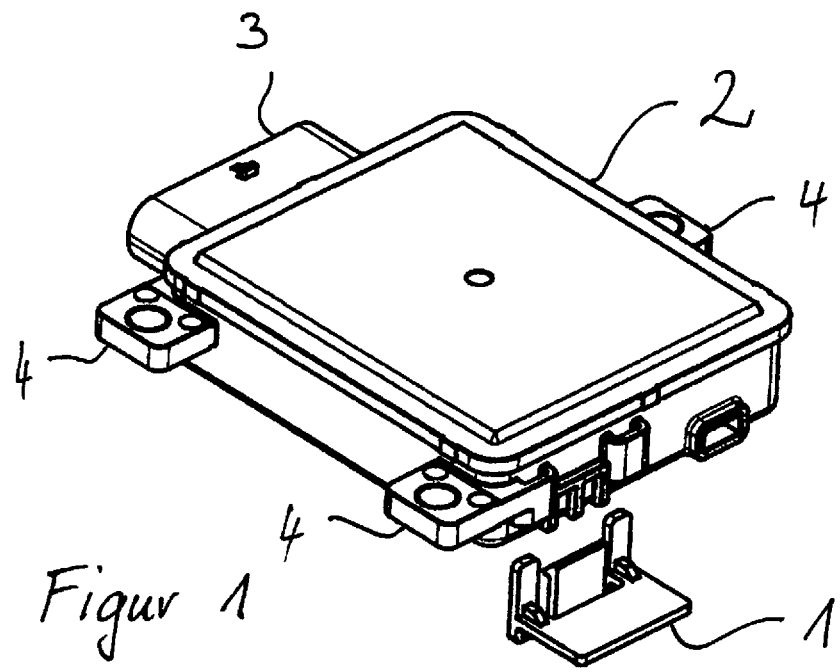
Figur 1
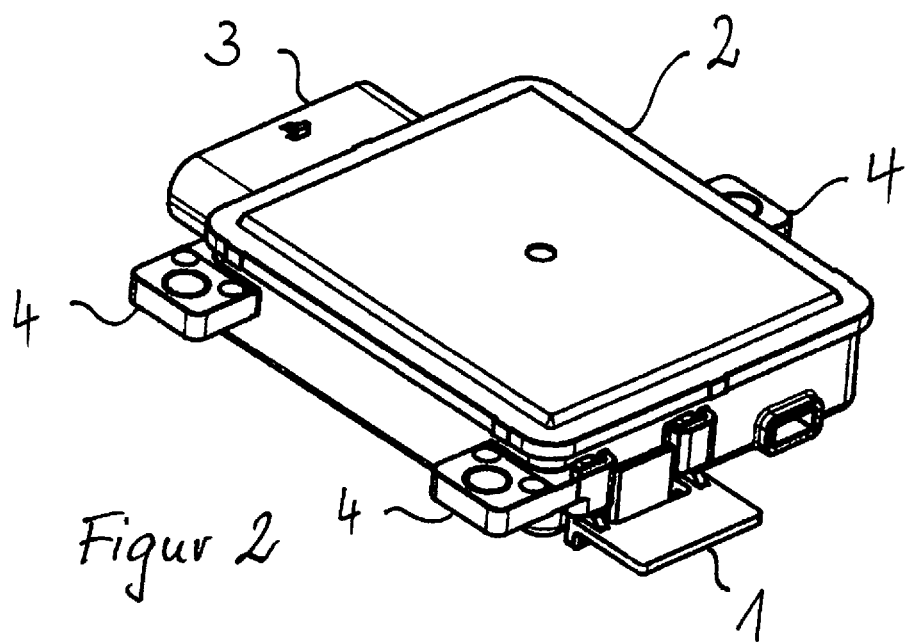
Figur 2

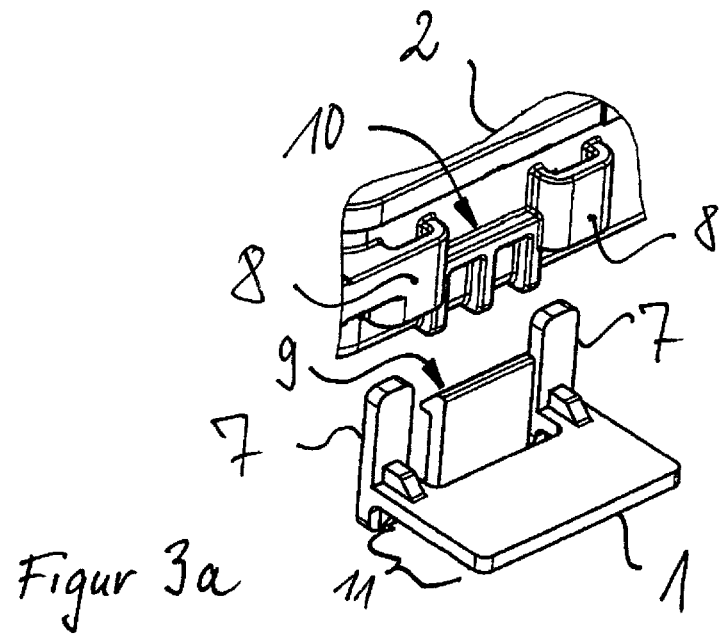
Figur 3a
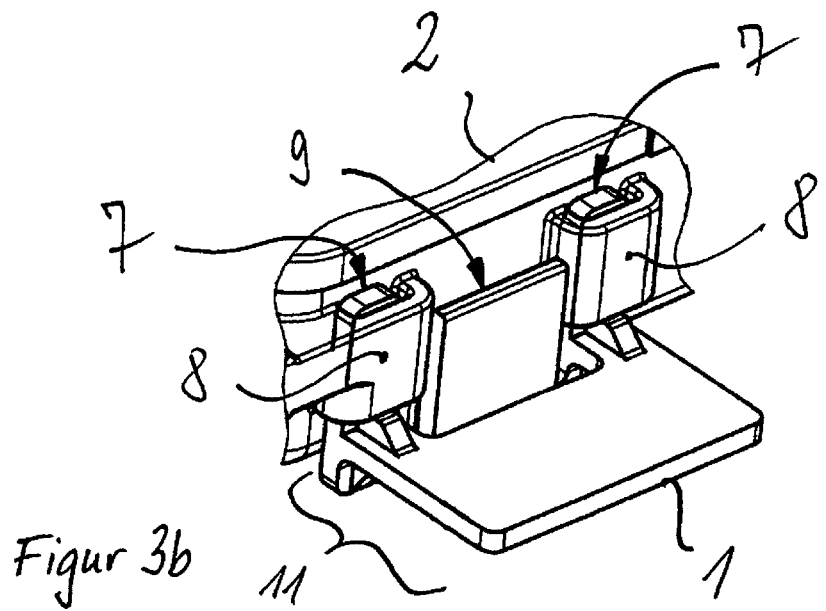
Figur 3b

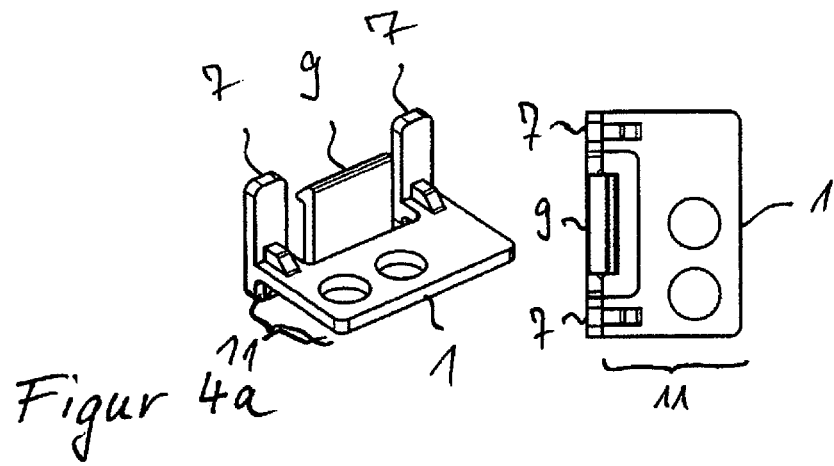
Figur 4a
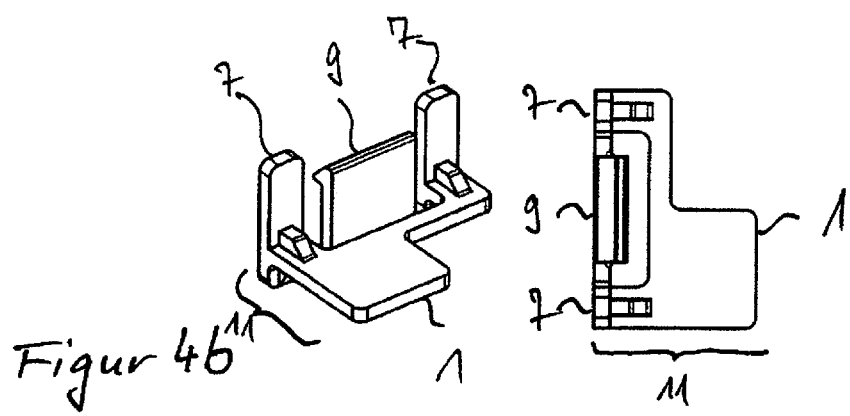
Figur 4b
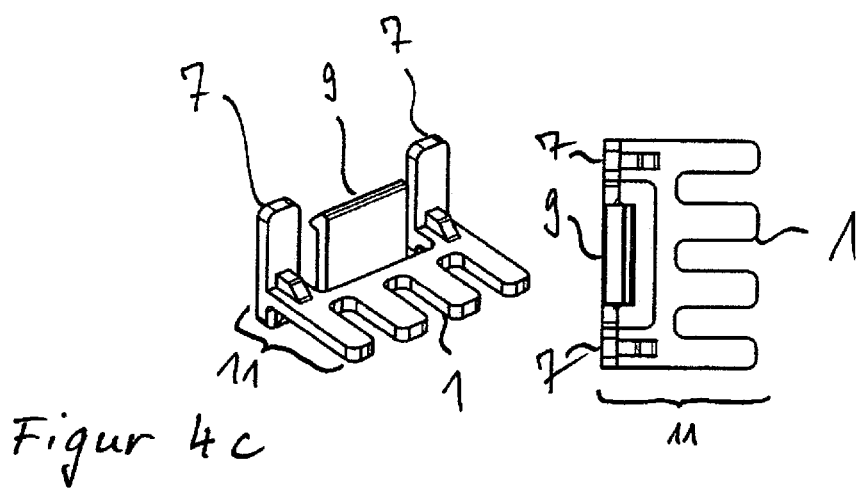
Figur 4c

DEVICE FOR ENSURING THE INSTALLATION OF A COMPONENT AT THE DESIGNATED INSTALLATION LOCATION OF SAID COMPONENT

FIELD OF THE INVENTION

The present invention relates to a device for ensuring the installation of a component at the designated installation location of said component in a system, made up of two parts, the first part of the device being attached to the component, and the second part of the device being attached to the system to which the component is attached, and, during an installation of the component into the system at the intended installation location of said component, the first part of the device and the second part of the device interlock precisely and enable assembly, in that the first part of the device and the second part of the device interact exclusively mechanically and exclusively enable the ensuring of the installation of the component at the proper installation location of said component in the system. When installing the component at a non-designated installation location on the system, the interaction of the first part of the device and the second part of the device, which form a poka-yoke system with each other, prevents installation.

BACKGROUND INFORMATION

German Published Patent Application No. 101 56 049 describes a housing system for safety-relevant control units in motor vehicles, in which a receiving part attached to the vehicle body and a housing part insertable into the receiving part are shown. The receiving part and the housing part encompass complementary form-fit elements which represent a coding and engage into each other during the installation of the housing part in the receiving part and permit the completed installation only when the form-fit elements of the receiving part and the housing part meet a predefined condition of being complementary.

In the case of electrical plug connections, it is also frequently typical to design plug sockets and plugs in cross-sectional shapes, so that the plug sockets and plugs may be brought into a plug connection with one another in only one way and an improper contacting is otherwise prevented. In the case of such plug connections, a mechanical improper contacting is avoided with the aid of the plug and the plug socket shape and, simultaneously, the electrical contacting is established. Due to the connection of various plug types and plug socket types, it is possible to install only components related to each other into appropriate systems. The disadvantage of this technology is that, in the case of a diversity of variants of the component, different plug types must be kept on hand and, if necessary, the entire plug device must be replaced by another plug device in order to change the variant. This is logistically highly complex and may be time intensive.

SUMMARY

The scope of the present invention is to install a component at the designated installation location of said component in a system, all different components having the same plug connection and the installation of the component at the designated installation location of said component being permitted merely through the use of a mechanical coding component. The mechanical coding component is designed to be quickly and easily detachable and replaceable by another component.

Advantageously, it is provided that the first part of the device and the second part of the device prevent installation in the case of an installation of the component at a non-designated installation location on the system. This is achieved in that the two parts are matched to each other in such a way that only the two related parts bijectively engage into each other.

Moreover, it is advantageous that the first part of the device is nondestructively removably attached to the component and the second part of the device is also nondestructively removably attached to the system. As a result, it is possible, in the case of a reprogramming or reparameterization of the component, to install the component at another designated installation location, the installation at the new installation location requiring, as preparation, only that the first part on the component be replaced. For this purpose, it may be provided, for example, that the first part may be removed with the aid of a detachable bolted connection or with the aid of a mechanical locking connection which is easily detachable.

Moreover, it is advantageous that the first part of the device is attached to the component and/or the second part of the device is attached to the system with the aid of a snap-in connection.

Moreover, it is advantageous that the first part of the device is attached to the component and/or the second part of the device is attached to the system with the aid of a snap-in hook and two guide blades. In this case, the first part is fixed with respect to the component with the aid of the two guide blades and the snap-in hook prevents the guide blades from sliding out of the guide tabs integrally formed on the component.

Moreover, it is advantageous that the first part of the device on the component and/or the second part of the device on the system are/is designed as a plastic injection-molded part or as a bent sheet-metal part.

Moreover, it is advantageous that the first part of the device on the component and the second part of the device on the system form a poka-yoke system. Poka-yoke systems are devices which prevent an installation or an establishment of a connection when both the first and the second parts are not to be connected to one another or installed in this combination. A problem-free installation or connection is possible with the aid of the poka-yoke system only when the component is to be properly installed at this place of the system. Therefore, a bijective assignment of the component to the designated installation location is possible.

Moreover, it is advantageous that the system is a vehicle, in particular a motor vehicle. Moreover, it is advantageous that the component is a sensor of a surroundings sensor system, in particular a radar sensor, an ultrasonic sensor, a LIDAR sensor, or another sensor.

Modern motor vehicles usually include multiple partially identical surroundings sensors, the different sensors having various software variants or at least parameterizations, so that a sensor which is provided, by way of example, for the left side of the vehicle is not permitted to be mounted on the right side of the vehicle, or a sensor which is provided on the front of the vehicle is not permitted to be mounted on the rear of the vehicle. The described device, made up of bijectively matching first and second parts, makes it possible to install a component, in particular a surroundings sensor, only at the place of the motor vehicle at which the complementary second device is installed. In this case, it is important that a component receives a new designated installation location, for example, by flashing new software or changing the parameterization; for this purpose, the poka-yoke elements, which permit the installation only at the designated location, must be replaced quickly and with little outlay. If an unambiguous coding is implemented with the aid of the plug connection of the sensor, the plug would also have to be replaced, which is avoided with the aid of the present invention, since only the first part of the device or the second part of the device must be replaced in this case, with the aid of nondestructively removable connections. It is therefore possible to utilize the same type of plug for all variants of the component, which lowers the costs and ensures simplicity of the logistics.

Further features, possible applications, and advantages of the present invention result from the following description of exemplary embodiments of the present invention, which are represented in the figures of the drawing. In this case, all described or represented features, either alone or in arbitrary combination, are the subject matter of the present invention, irrespective of their summary in the patent claims or their back reference, and irrespective of their wording or representation in the description or in the drawings.

BRIEF DESCRIPTION OF THE DRAWINGS

FIG. 1 shows a component including an uninstalled, first part of the coding unit.

FIG. 2 shows a component including an installed first part of the coding device.

FIGS. 3a and 3b show an exemplary specific embodiment of the installation of the first part on the component in the unattached state and in the attached state, respectively, and FIGS. 4a through 4c show various specific embodiments of the mechanical coding of the first part of the device.

DETAILED DESCRIPTION

FIG. 1 shows a component 2 for installation in a system which may be, for example, a motor vehicle. This represented component 2 may be, for example, a sensor element which detects the vehicle surroundings and may be designed, for example, as an ultrasonic sensor or a radar sensor. Such sensors are equipped with different software or different parameters, depending on the designated installation location or vehicle model, so that the installation of a sensor does not need to take place at an arbitrary vehicle position, but rather at the proper intended position. Depicted component 2, which is designed as a radar sensor, by way of example, encompasses an electrical connection contact 3 on one side of the housing, with the aid of which electrical connections to other system components may be established, for example, in order to evaluate and further process the measuring signals from the sensor. The advantage of the present invention is that all components 2, despite different installation locations, may encompass the same connection contacts 3, since the designated installation location is not predefined by different connection plugs 3. This allows for a cost-effective manufacturing of component 2 and makes it possible to subsequently change the designated installation location of component 2 without the need to change the plug. Moreover, component 2 encompasses housing tabs 4 on the sides, with the aid of which component 2 may be attached to the vehicle or to vehicle components, for example, in that the tabs include holes, with the aid of which the component is attached to and aligned on the vehicle chassis. These fastening tabs 4, with the aid of which the mechanical fastening of component 2 to the vehicle takes place, may also be utilized for all installation locations on the vehicle with respect to the same tab sizes and tab types, which saves an expensive diversity of variants of the fastening elements. Fastening devices for fastening first part 1 of the device on component 2 are shown on the represented front side of component 2, which will be dealt with in greater detail in FIGS. 3a and 3b.

FIG. 2 shows the same component 2 as in FIG. 1, which also encompasses electrical connection contact 3 on one component side and, on further component sides, fastening tabs 4 for mechanically fastening component 2 to the vehicle. First part 1 of the device is also represented on the shown component front side, first part 1 now being represented in the installed state in FIG. 2, deviating from the representation in FIG. 1. As shown in FIGS. 3a and 3b, this installation may take place with the aid of guide blades and snap-in hooks, so that a detachment of this first part 1 of the device 1 may take place by elastically bending the snap-in hook upward and removing the guide blades from the guide tabs. Alternatively, another, nondestructively removable installation of first part 1 of the device is also possible, of course, for example, with the aid of a detachable bolted connection which attaches first part 1 of the device to a threaded hole on component 2, in that a screw is screwed in. In this case as well, a replacement of first part 1 of the device is possible in a nondestructive manner by releasing the threaded connection, and first part 1 of the device may be replaced by another variant of first part 1 of the device.

A detailed view of the depiction in FIG. 1 is represented in FIG. 3a. Component 2, which may be a radar sensor, by way of example, is also apparent. Moreover, first part 1 of the device is represented in the uninstalled state. Component 2 encompasses at least one, advantageously two, guide tabs 8 on one side of the housing. First part 1 of the device also encompasses at least one, advantageously two, guide blades 7 which are designed, with respect to their size, in such a way that guide blades 7 fit into guide tabs 8 of component 2. If first part 1 of the device is now slid, via the two guide blades 7, into guide tabs 8 of component 2, first part 1 of the device is attached to component 2. If the two guide blades 7 reach their end position in guide tabs 8, snap-in hook 9 on first part 1 of the device snaps into detent edge 10 on the outer housing side of component 2. As a result, first part 1 of the device is locked in its position on component 2, since guide blades 7 may no longer be able to slide out of guide tabs 8. This installed state, in which first part 1 of the device is nondestructively removably attached to component 2, is represented in FIG. 3b. In FIG. 3b, it is also apparent how guide blades 7 have reached their end position in guide tabs 8 and snap-in hook 9 has been locked in position with the aid of detent edge 10. First part 1 of the device encompasses a further area 11 which is represented in FIGS. 3a and 3b as coding area 11. In this area, recesses in the form of comb structures or holes may be provided, into which the counterpart engages in such a way that an assembly of component 2 with first part 1 of the device is possible only when the designated installation location has been selected, and an interference-free installation is prevented in all other cases. The attachment of first part 1 of the device to component 2 shown in FIGS. 3a and 3b may also be easily released again, in that snap-in hook 9 is bent upward within the elastic bending range, so that detent edge 10 is released, whereupon guide blades 7 may be pulled out of guide tabs 8 and first part 1 of the device may be easily removed without the aid of a tool. Alternatively, it may also be provided that, instead of the installation with the aid of guide tabs 7 and snap-in hook 9, one or multiple bolted connections may be utilized or a combination of guide blades 7 and guide tabs 8 including a bolted connection for securing same.

FIGS. 4*a* through 4*c* show the various embodiments of first parts 1 of the device, all variants of FIGS. 4*a*, 4*b*, and 4*c* encompassing identical guide blades 7 and snap-in hooks 9. First parts 1 of the device according to FIGS. 4*a* through 4*c* differ in terms of the design of particular coding areas 11. Due to the bijective assignment of first parts 1 of the device to the second parts of the device, which are not represented in the figures, it is ensured that only related first parts 1 and second parts of the device may be assembled together. For example, a coding area 11 which encompasses two circular holes is shown in FIG. 4*a*. For example, the counterpart, which forms the second part of the device, may encompass two comb-shaped blades or two cylindrical raised areas on the counterpart, which, in the installed state, extend through the two holes in coding area 11. A counterpart which is provided for a non-designated installation location may encompass, for example, three blades or three cylindrical raised areas, so that, in the upper area of coding area 11, in which a third hole is lacking, the second part of the device may not be able to engage into the first part of the device and, therefore, assembly is prevented.

FIG. 4*b* shows one further specific embodiment of the first part 1 of the device, in which is present in coding area 11 in one half and has been removed in a further half. The counterpart of first part 1 of the device, which forms the second part of the device, must therefore include complementary recesses or available areas, so that the counterpart may engage into the depicted section.

A further possibility, in particular when several variants are provided, is possible due to the variant in FIG. 4*c*, in which a coding area 11 is represented in the shape of a comb including four blades and three recesses, which are represented by way of example. The counterpart to this first part 1 of the device must therefore include four recesses, into which the four blades of first part 1 of the device may engage and must also include raised areas at the three points at which first part 1 of the device includes recesses. Further combinations, in particular also combinations of holes and comb-shaped structures, are possible, of course.

What is claimed is:

1. A device for ensuring an installation of a component at a designated installation location of the component in a system, comprising:
   two parts, wherein:
   a first part is attached to the component,
   a second part of the device is attached to the system to which the component will be attached,
   during installation of the component into the system at the designated installation location of the component, the first part and the second part interlock precisely, and
   the first part and the second part interact exclusively mechanically and exclusively enable an ensuring of the installation of the component at the designated installation location of the component in the system,
   wherein at least one of the first part on the component and the second part on the system is attached with the aid of a snap-in hook and two guide blades,
   wherein the component includes (i) an electrical connection contact on one side of the component, and (ii) multiple housing tabs on at least one other side of the component, each housing tab having at least one hole.

2. The device as recited in claim 1, wherein the first part and the second part prevent installation in the case of an installation of the component at a non-designated installation location on the system.

3. The device as recited in claim 1, wherein:
   the first part is nondestructively removably attached to the component, and
   the second part of the device is nondestructively removably attached to the system.

4. The device as recited in claim 1, wherein at least one of the first part on the component and the second part on the system is attached with the aid of a snap-in connection.

5. The device as recited in claim 1, wherein at least one of the first part on the component and the second part on the system is one of a plastic injection-molded part and a bent sheet-metal part.

6. The device as recited in claim 1, wherein the first part on the component and the second part on the system form a poka-yoke system.

7. The device as recited in claim 1, wherein the system is a vehicle.

8. The device as recited in claim 1, wherein the system is a motor vehicle.

9. The device as recited in claim 1, wherein the component is a sensor of a surroundings sensor system.

10. The device as recited in claim 9, wherein the sensor includes one of a radar sensor, an ultrasonic sensor, and a LIDAR sensor.

* * * * *